(12) United States Patent
Sumida et al.

(10) Patent No.: US 6,460,774 B2
(45) Date of Patent: Oct. 8, 2002

(54) REMOTE CONTROLLER FOR AIR-CONDITIONING APPARATUS

(75) Inventors: Hisashi Sumida; Mitsuhiko Yamamoto, both of Osaka (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 09/869,344

(22) PCT Filed: Nov. 29, 2000

(86) PCT No.: PCT/JP00/08462

§ 371 (c)(1),
(2), (4) Date: Jun. 28, 2001

(87) PCT Pub. No.: WO01/40715

PCT Pub. Date: Jun. 7, 2001

(65) Prior Publication Data

US 2002/0124584 A1 Sep. 12, 2002

(30) Foreign Application Priority Data

Nov. 30, 1999 (JP) .......................... 11-341142

(51) Int. Cl.⁷ .............................................. F24F 11/02
(52) U.S. Cl. .............................. 236/51; 236/94; 62/298
(58) Field of Search ...................... 236/51, 94, 47, 236/49.3; 165/205, 209; 62/298

(56) References Cited

U.S. PATENT DOCUMENTS

| | | | |
|---|---|---|---|
| 5,176,006 A | | 1/1993 | Ikawa et al. .............. 62/125 |
| 5,839,654 A | * | 11/1998 | Weber .................. 236/51 X |
| 5,927,599 A | * | 7/1999 | Kath .................... 236/51 X |
| 6,213,404 B1 | * | 4/2001 | Dushane et al. ........ 165/205 X |
| 6,264,111 B1 | * | 7/2001 | Nicolson et al. .............. 236/51 |

FOREIGN PATENT DOCUMENTS

| | | |
|---|---|---|
| DE | 85 09 643 | 9/1985 |
| DE | 197 28 803 | 8/1999 |
| JP | 4-371743 | 12/1992 |
| JP | 9-224295 | 8/1997 |

OTHER PUBLICATIONS

CD–ROM of the specification and drawings annexed to the request of Japanese Utility Model Application No. 50098/1991 (Laid–open No. 3825/1993) (Toshiba Home Techno. K.K.), Jan. 22, 1993, Full text; Figs. 1 to 7.

CD–ROM of the specification and drawings annexed to the request of Japanese Utility Model Application No. 45746/1993 (Laid–open No. 16487/1995) (Toshiba Corporation), Mar. 17, 1995, Full text; Figs. 1 to 5.

* cited by examiner

Primary Examiner—Harry B. Tanner
(74) Attorney, Agent, or Firm—Nixon Peabody LLP; Donald R. Studebaker

(57) ABSTRACT

The present invention is provided with a remote controller case having an opening for air intake. The remote controller case includes a circuit board provided with a temperature detection circuit. The circuit board has a temperature sensor 26 corresponding to the opening for air intake. When the air-conditioning apparatus is installed, the output data of the temperature sensor 26 are corrected according to the installing environment. After the air-conditioning apparatus is installed, the output data of the temperature sensor 26 are corrected to have a temperature lowered by a predetermined degree to make the remote controller perform a temperature control operation.

4 Claims, 6 Drawing Sheets

REMOTE CONTROLLER FOR AIR-CONDITIONING APPARATUS

TECHNICAL FIELD

The present invention relates to a remote controller for an air-conditioning apparatus having the function of detecting temperatures.

BACKGROUND ART

In general, the indoor unit of an air-conditioning apparatus has a remote controller which controls various operations of the apparatus including its run/halt control and which also performs initial setting of the apparatus.

Some recent remote controllers, which are closer to the users than the indoor units are, include a temperature sensor such as a thermistor. These remote controllers have a temperature control feature which achieves a target temperature set in advance, based on the room temperature detected by the temperature sensor.

Such a prior art remote controller having the temperature control feature is provided with a temperature sensor such as a thermistor at one end of the circuit board like a printed board stored inside the remote controller case. The remote controller case has an opening grille for room air intake at the position corresponding to the temperature sensor. The temperature of the room is detected by introducing the room air whose temperature is to be controlled to the temperature sensor through the slit of the opening grille.

Problem Solution

However, the circuit board in the remote controller case is provided with heat-producing electric components including coil members such as mains coils, resistance, and IC, so that the remote controller case is likely to get warm inside. This heat acts on the temperature sensor, possibly preventing it from detecting the accurate temperature of the room.

This problem could be ignored when the area in the room to be air-conditioned by the air-conditioner (indoor unit) is in a good correspondence with the position where the remote controller is installed so that the air of the area can be smoothly introduced to the opening grille for air intake of the remote controller.

However, if the air around the remote controller is poorly circulated due to the structure or environmental conditions of the room in which the air-conditioning apparatus (indoor unit) is installed, it often happens that the air of the area to be air-conditioned fails to act on the temperature sensor properly. In this case, the temperature control operation by the remote controller (hereinafter referred to as a remote control operation) which is an expected feature of the remote controller fails to achieve comfortableness.

The present invention has been contrived to solve this problem, and has an object of providing a remote controller for air-conditioning apparatus which can perform proper temperature control.

To be more specific, the present invention makes it possible that at the time of installment of the air-conditioning apparatus, the output data of the temperature sensor is set in such a manner as to be decreased by a predetermined degree of temperature as necessary in accordance with the installing environment of the air-conditioning apparatus. This can solve the problem that the temperature sensor detects temperatures higher than the actual temperatures of the room. As a result, a proper remote control operation can be realized after the installment of the air-conditioning apparatus.

DISCLOSURE OF THE INVENTION

The present invention is provided with the following problem-solving means in order to achieve the above-mentioned object.

(1) First Invention

This invention is a remote controller for an air-conditioning apparatus comprising: a remote controller case 1 having an opening for air intake 5; a circuit board 10 having a temperature detection circuit stored in said remote controller case 1; and a temperature sensor 26 provided in said circuit board 10 in such a manner as to correspond to said opening for air intake 5. The invention further comprises: a temperature sensor output data correction means 43 for correcting output data of said temperature sensor 26; and a temperature data correction setting means for determining whether or not to operate said temperature sensor output data correction means (43).

In the above structure, at the time of installment of the air-conditioning apparatus, the temperature data correction setting means so sets the temperature sensor output data correction means 43 on the scene as to operate in accordance with the installing environment. When this setting is done, in the subsequent remote control operation, the output data of the temperature sensor 26 are continually corrected by the temperature sensor output data correction means 43 to be read into the microcomputer as appropriate temperatures.

Consequently, when the user uses the remote controller, the detected temperatures are automatically corrected to have appropriate temperatures in accordance with the circulation levels of the air in the installing environment of the air-conditioning apparatus. As a result, it becomes possible to realize comfortableness expected from the temperature control by the remote controller.

(2) Second Invention

In this invention, said temperature sensor output data correction means 43 is so structured as to correct said output data of said temperature sensor 26 in such a manner as to lower said output data by a predetermined degree of temperature.

In the above structure, at the time of installment of the air-conditioning apparatus, the temperature data correction setting means so sets the temperature sensor output data correction means 43 on the scene as to operate in accordance with the installing environment. When this setting is done, in the subsequent remote control operation, the output data of the temperature sensor 26 are continually corrected by the temperature sensor output data correction means 43 to have temperatures lowered by predetermined degrees. As a result, the output data are read into the microcomputer as the temperatures lowered by the predetermined degrees.

Consequently, when the user uses the remote controller, the detected temperatures are automatically corrected to have appropriate temperatures in accordance with the circulation levels of the air in the installing environment of the air-conditioning apparatus. As a result, it becomes possible to realize comfortableness expected from the temperature control by the remote controller.

(3) Third Invention

In this invention, said temperature data correction setting means is composed of a jumper wire 24 provided on said circuit board 10 in such a manner as to correspond to said temperature sensor 26, and is so structured as to operate said temperature sensor output data correction means 43 based on a cut of said jumper wire 24.

In the above structure, at the time of installment of the air-conditioning apparatus, the jumper wire 24 is cut on the scene in accordance with the installing environment. When this cutting is done, in the subsequent remote control operation, the output data of the temperature sensor 26 are continually corrected by the temperature sensor output data correction means 43. For example, the output data are read into the microcomputer as temperatures lowered by predetermined degrees.

Consequently, when the user uses the remote controller, the detected temperatures are automatically corrected to have appropriate temperatures in accordance with the circulation levels of the air in the installing environment of the air-conditioning apparatus. As a result, it becomes possible to realize comfortableness expected from the temperature control by the remote controller.

(4) Fourth Invention

In this invention 4, said temperature data correction setting means is composed of a switch provided on said circuit board 10 in such a manner as to correspond to said temperature sensor 26, and operates said temperature sensor output data correction means 43 based on an ON condition of said switch.

In the above structure, at the time of installment of the air-conditioning apparatus, on the scene the switch is turned on in accordance with the installing environment. When the switch is in the ON position, in the subsequent remote control operation, the output data of the temperature sensor 26 are continually corrected by the temperature sensor output data correction means 43. For example, the output data are read into the microcomputer as temperatures lowered by predetermined degrees.

Consequently, when the user uses the remote controller, the detected temperatures are automatically corrected to have appropriate temperatures in accordance with the circulation levels of the air in the installing environment of the air-conditioning apparatus. As a result, it becomes possible to realize comfortableness expected from the temperature control by the remote controller.

Effects of the Invention

As a result of these described above, according to the remote controller for air-conditioning apparatus of the present invention, comfortableness expected from the temperature control by the remote controller can be realized regardless of the positions of the air-conditioning apparatus and remote controller and the circulation of the air between them.

BEST MODE FOR CARRYING OUT THE INVENTION

FIGS. 1 through 8 show the structure of the remote controller for an air-conditioning apparatus of the embodiment of the present invention.

Structure of the Main Parts of the Remote Controller

Figure 1:
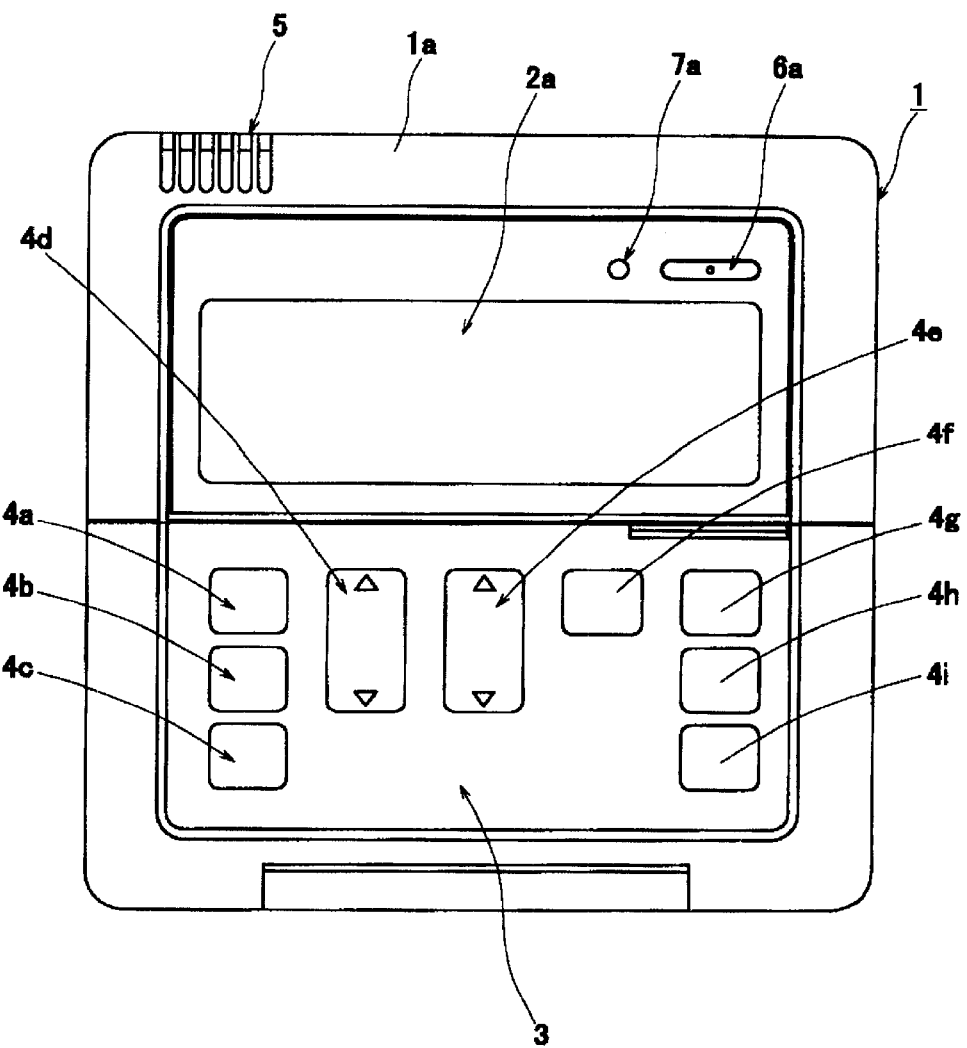
FIG. 1 shows the front view of the main case of the remote controller for an air-conditioning apparatus of the embodiment of the present invention.
Figure 2:
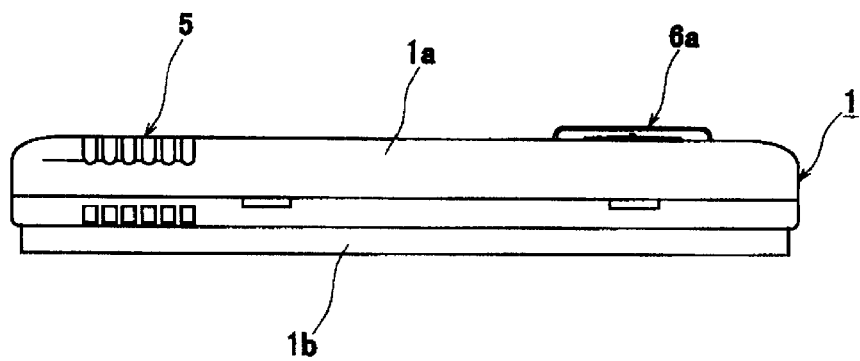
FIG. 2 shows the top view of the main case of the same.
Figure 3:
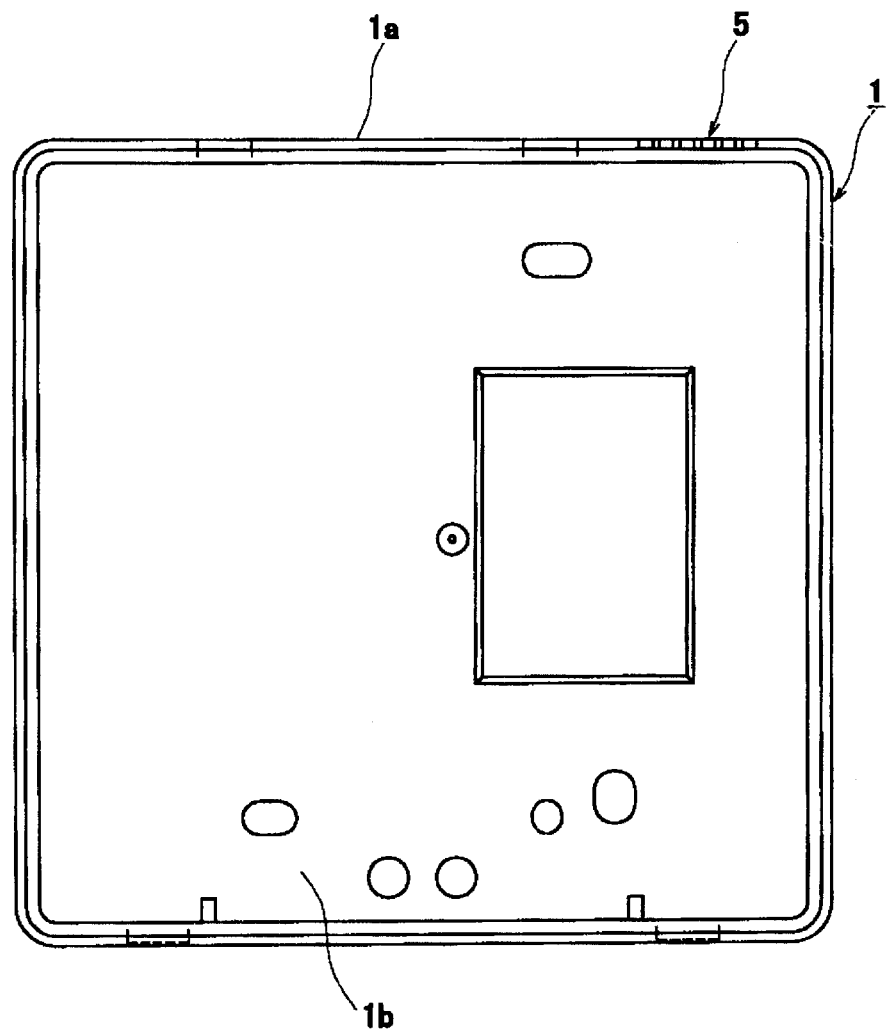
FIG. 3 shows the back view of the main case of the same.

FIGS. 1 through 3, a main case 1 of the remote controller is composed of a first outer case 1a for the front side and a second outer case 1b for the back side which are combined to be shaped like a flat box.

At the top on the front side of the first outer case 1a is provided a liquid crystal panel 2a for displaying various kinds of information. At the bottom on the front side of the first outer case 1a is provided an operating panel 3 having various operating keys which have flexibility. These operating keys each have a conductive sheet for contact closing on their back side. Included in the operating keys are a ventilating operation shift key 4a, a ventilating volume control key 4b, an inspection/trial run key 4c, a timer setting time up/down key 4d, a setting temperature control up/down key 4e, a wind direction shift key 4f, an operation shift key 4g, a wind volume control key 4h, and a filter sign/reset key 4i.

At the right above the liquid crystal panel 2a are provided a run/halt key 6a and a run/halt display unit 7a abreast with each other.

At the top left of the first outer case 1a and the top right of the second outer case 1b of the main case 1 are provided opening grilles 5, 5 for room air inlet. The main case 1 is so structured that the air of the room is introduced thereto through the opening grills 5, 5.

Structure of the Circuit Board Part

Figure 4:
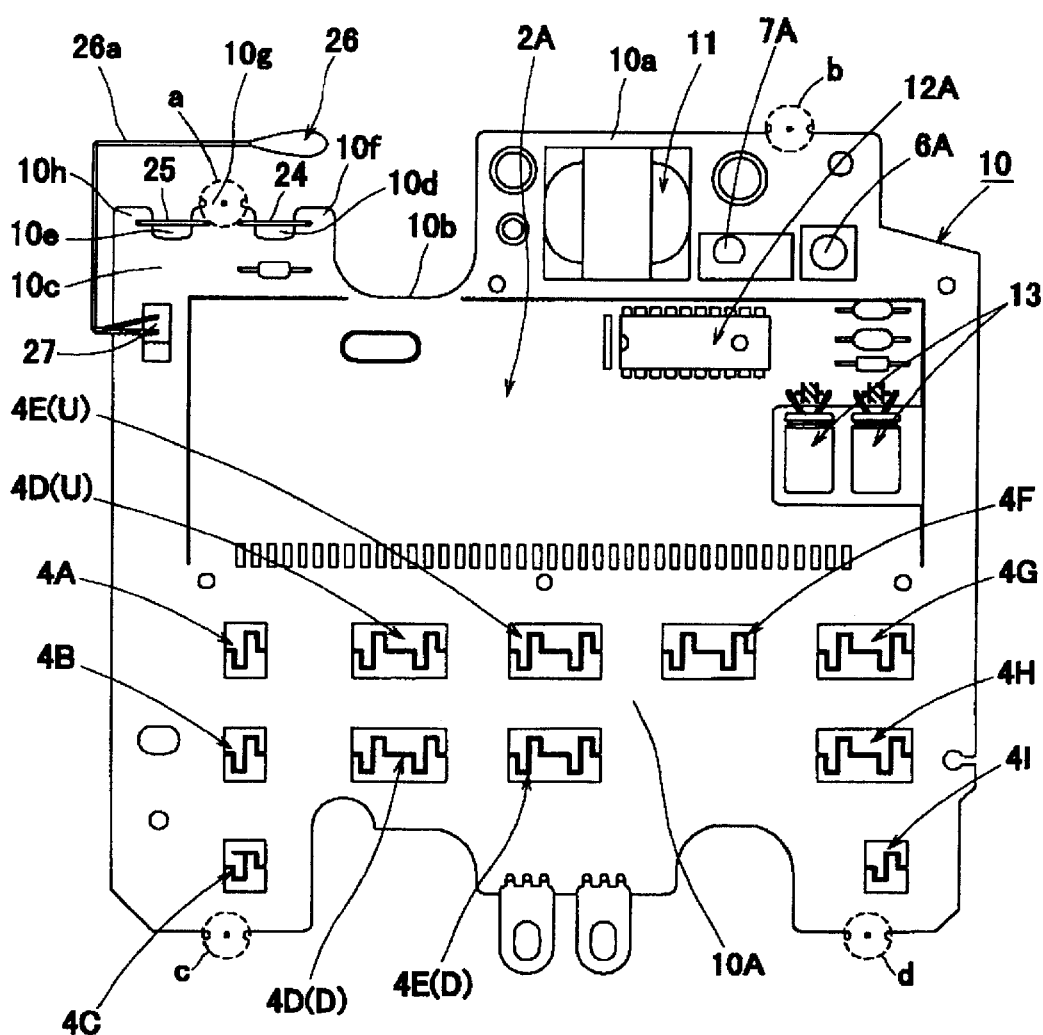
FIG. 4 shows the front view of the circuit board stored in the main case of the remote controller.
Figure 5:
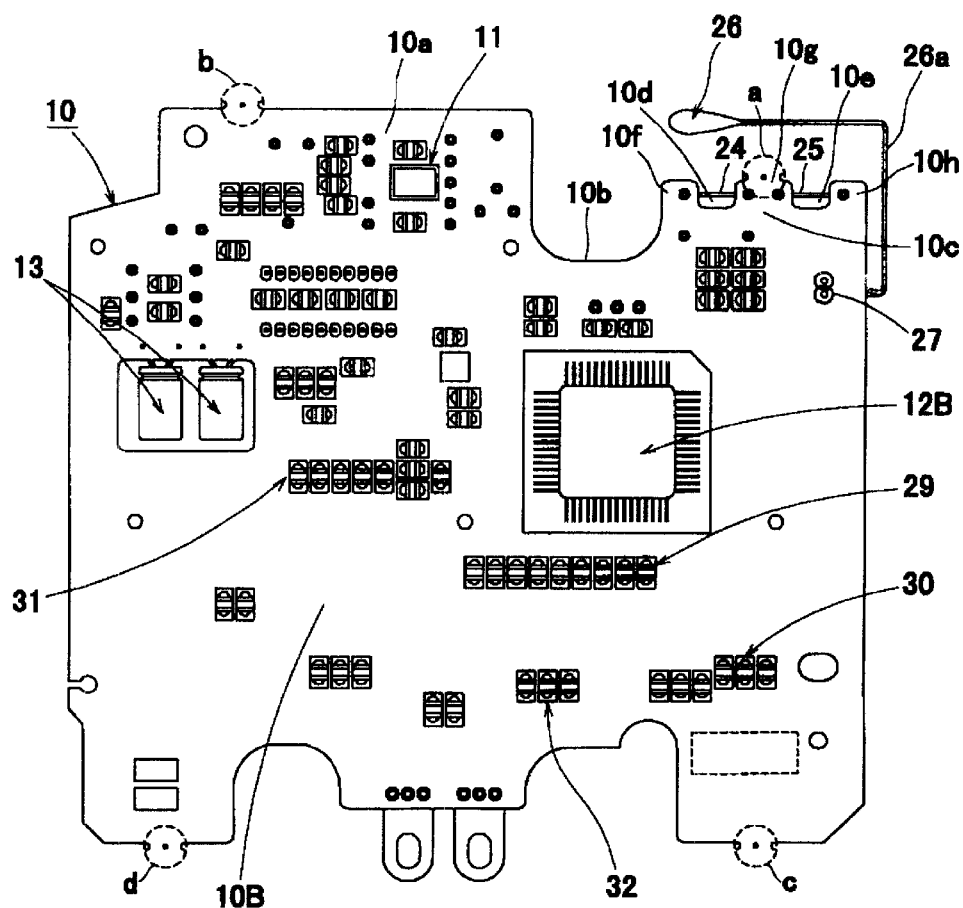
FIG. 5 shows the back view of the circuit board.
Figure 6:
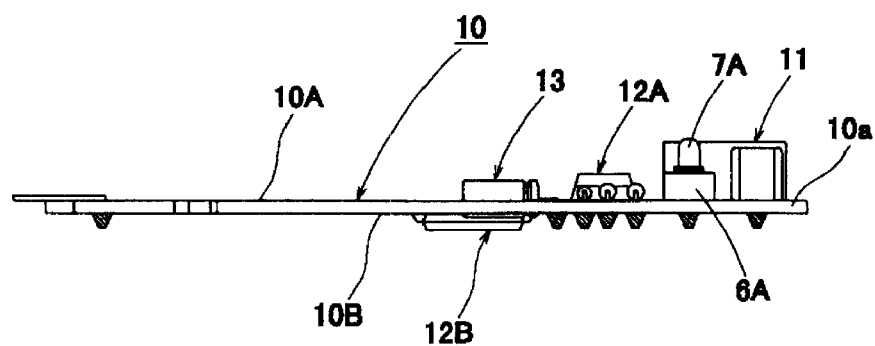
FIG. 6 shows the right-side view of the circuit board.

FIGS. 4 through 6 show the structure of the circuit board 10 stored in the main case 1 of the above-mentioned remote controller.

The circuit board 10 is composed of a well-known single-sided printed circuit board as apparent from FIGS. 4 to 6, and is attachable to the first outer case 1a by using unillustrated predetermined screw members at four spots on the perimeter which correspond to attachment parts (boss parts) a–d on the back side of the first outer case 1a.

Slightly above the center portion on a front-side part 10A of the circuit board 10 is provided a liquid crystal display installing part 2A.

At the bottom of the circuit board 10 are provided make-and-break contacts 4a, 4B, 4C, 4D (U). 4D (D), 4E (U). 4E (D), 4F, 4G, 4H, and 4I each having a pair of crank-shaped conductive foil contacts. These make-and-break contacts 4a to 4I are closed according as the ventilating operation shift key 4a, ventilating volume control key 4b, inspection/trial run key 4c, timer setting time up/down key 4d, setting temperature control up/down key 4e, wind direction shift key 4f, operation shift key 4g, wind volume control key 4h, and filter sign/reset key 4i are turned on.

From the top right to top left of the circuit board 10 are provided a run/halt switch 6A corresponding to the run/halt key 6a, a light-emitting diode 7A indicating the run/halt conditions, a power coil 11, a first jumper wire 24 as temperature data correction setting means for generating criteria signals to indicate whether or not to correct the output data of the temperature sensor 26 which detects the temperature of the air in the room before starting a remote control thermal operation, a second jumper wire 25 which switches between different types of remote controller depending on the type of the indoor unit, and the temperature sensor 26 for detecting the temperature of the air in the room.

On the right portion of the liquid crystal display installing part 2A are provided a first IC 12A having an interactive communication control circuit for an unillustrated outdoor or indoor unit, and capacitors 13, 13.

The temperature sensor 26 is laid out as illustrated. To be more specific, a right-side board part 10a having a power coil 11 which is a heat-producing component and a left-side board part 10c are thermally separated from each other with a comparatively wide hollow portion (notch) 10b for providing an air passage therebetween. At the left-side end of the left-side board part 10c is provided a terminal part 27. The temperature sensor 26 is connected with the terminal part 27 via a lead 26a. The lead 26a has a considerable length, flexibility and stiffness.

The lead 26a is bent to be U-shaped from ;the terminal part 27. The temperature sensor 26 is arranged to be as far from the board part 10c as possible and to face the opening grilles 5, 5 for room air inlet.

On the other hand, at the top right and top left of the left-side board part 10c are provided U-shaped hollow portions (notches) 10e and 10d, respectively. A first jumper wire 24 is stretched between protrude d portions 10h and 10g, which are at both sides of the hollow portion 10e, and a second jumper wire 25 is stretched between protruded portions 10g and 10f, which are at both sides of the hollow portion 10d.

Thus, a gap (space) of the proper size to insert a pair of pliers or the like thereinto is provided between the board part 10c and the first and second jumper wires 24 and 25. This gap enables a pair of pliers to be inserted thereinto from the back side in order to cut the first and second jumper wires 24 and 25 only by removing the second outer case 1b of the main case 1, for example when the installment of the air-conditioning, apparatus is completed. Consequently, the cutting operation is simplified.

The first and second jumper wires 24 and 25 are connected in parallel with each other; one end being supplied with a predetermined power-supply voltage+B (5V) and the other end being connected to the ground. The connection terminal of each of the first and second jumper wires 24 and 25 outputs a ground potential (0V) when the wire is not cut, and a power-supply potential+B (5V) when it is cut.

In the present embodiment, the output potential of the first jumper wire 24, which is the temperature data correction setting means, is used as a criteria signal to operate the temperature data correction signal generation means 42 of the microprocessor-controlled circuit unit which will be described below (refer to FIG. 7). On the other hand, the output potential of the second jumper wire 25 is used as a signal to switch between different types of remote controller as described above.

On a back-side part 10B of the circuit board 10 are provided various connectors 27, 28, 29, 30, and 31, which correspond to the electric components on the front-side part 10A, necessary printed circuit patterns (not illustrated), solder joints (not illustrated), and a second IC 12B for microcomputer, and other components.

Structure of the Microprocessor-controlled Circuit Unit

Figure 7:
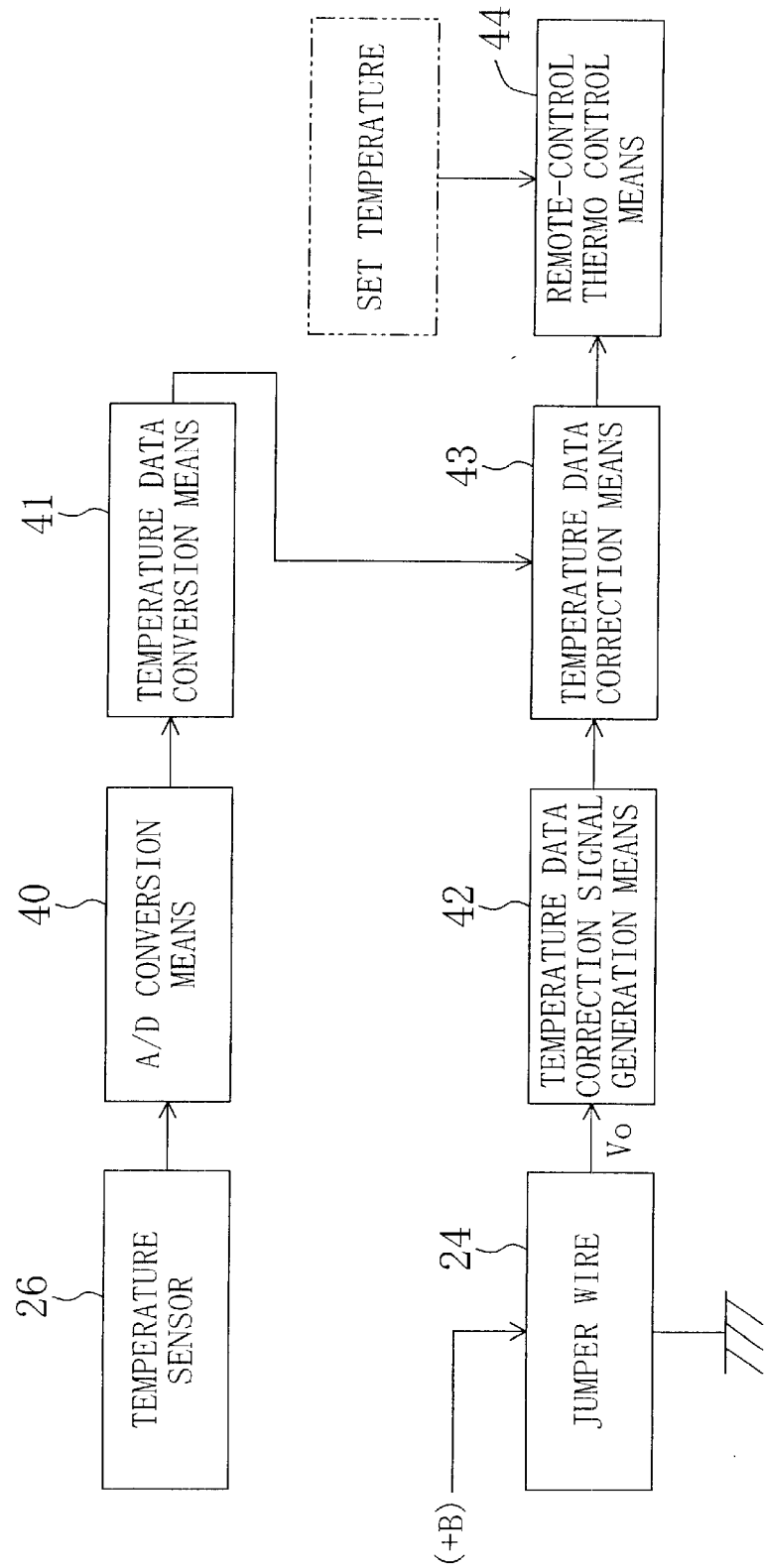
FIG. 7 is a block diagram showing the structure of the output data correction circuit of the temperature sensor in the microprocessor-controlled circuit unit of the remote controller.

As shown in FIG. 7, the microprocessor-controlled circuit of the second IC 12B comprises A/D conversion means 40, temperature data conversion means 41, temperature data correction signal generation means 42, which is generation means, and temperature data correction means 43.

The A/D conversion means 40 A/D converts temperature detection signals (analog voltage signals) of the temperature sensor 26, which detects the temperature of the room air introduced through the slit parts of the opening grilles 5, 5 so as to obtain digital signals.

The temperature data conversion means 41 converts the temperature detection signals that have been converted into the digital signals by the A/D conversion means 40 into digital data which specifically indicate temperature values.

The temperature data correction signal generation means 42 receives an output voltage value Vo which differs depending on whether the first jumper wire 24 of the first and second jumper wires 24, 25 is cut or not (when it is cut, Vo=+B=5 V, and when it is not cut, Vo=ground potential=0 V). Then, the temperature data correction signal generation means 42 generates temperature data correction signals when the first jumper wire 24 is cut (Vo=+B=5 V), and does not generate them when the first jumper wire 24 is not cut (Vo=ground potential=0 V).

When the temperature data correction signal generation means 42 is generating temperature data correction signals, the temperature data correction means 43 makes the remote-control thermo control means 44 operate after making a correction to temperature data Ti entered from the temperature data conversion means 41 so as to change the actually entered temperature data Ti into a temperature T (T=Ti−Δt) lower than the temperature data Ti by a predetermined temperature Δt (Δt=2° C., for example). On the other hand, when the temperature data correction signal generation means 42 is not generating the temperature data correction signals, the temperature data correction means 43 makes the remote-control thermo control means 44 operate while outputting the temperature data Ti received from the temperature data conversion means 41 without making ant correction to the data.

In this case, the correction value Δt is determined in consideration of the circulation levels of the air in the environment where the indoor unit and the remote controller are installed.

Operation of the Microprocessor-controlled Circuit Unit

Figure 8:
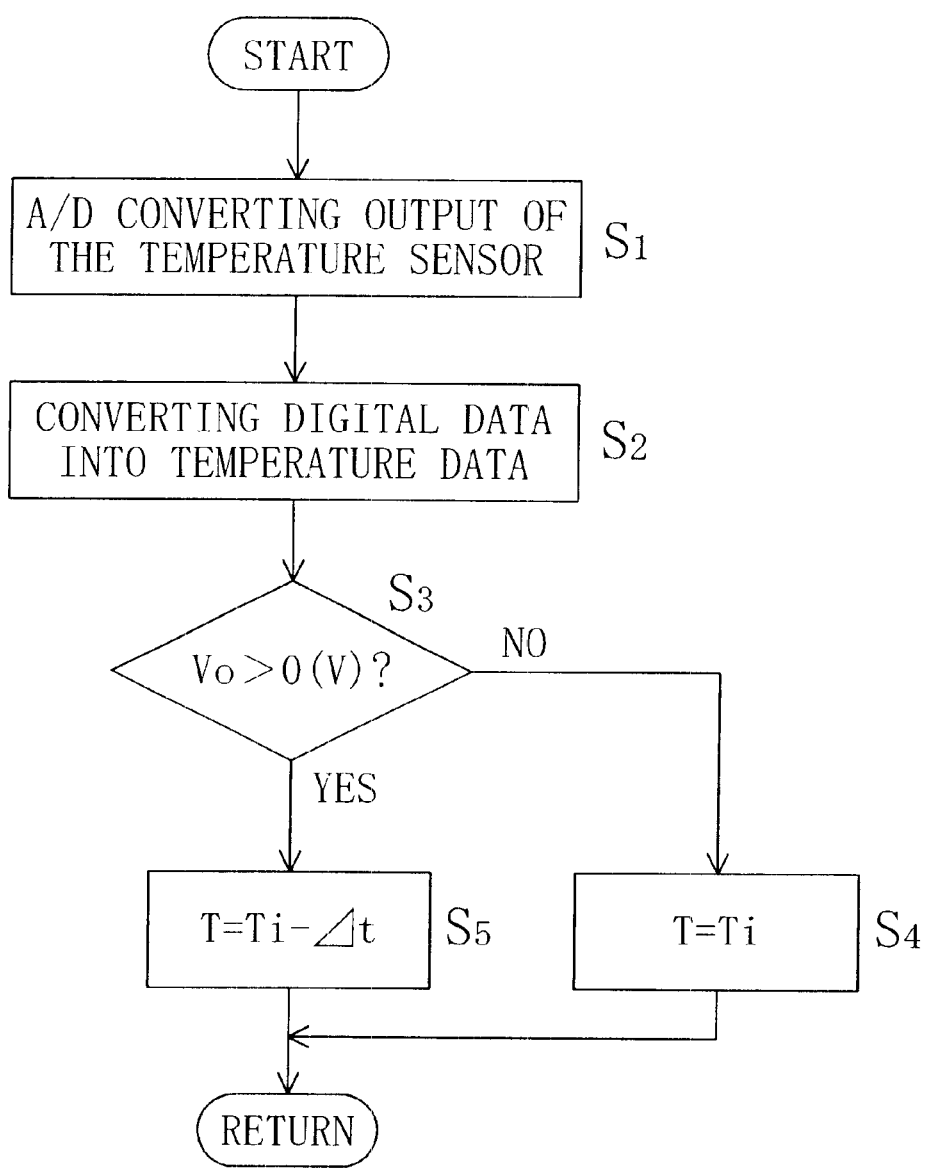
FIG. 8 is a flowchart showing operations to correct the output data of the temperature sensor in the circuit.

The operation to correct temperature data by the microprocessor-controlled circuit unit will be described with reference to the flowchart of FIG. 8.

The control of the correcting operation of the temperature data differs depending on the environmental conditions of the predetermined space where the air-conditioning apparatus is installed. To be more specific, this control varies depending on whether or not the indoor unit and its remote controller are installed in such locations that allow the air in the room to be smoothly introduced to the temperature sensor 26 through the slit parts of the opening grilles 5, 5. The control of the correcting operation of the temperature data is started with the operation of the air-conditioning apparatus on the precondition that the first jumper wire 24 is either cut or not cut.

When the run/halt key 6a of the air-conditioning apparatus is pushed to turn on the run/halt switch 6A corresponding to the run/halt key 6a, the output voltage detected by the temperature sensor 26 is entered to the A/D conversion means 40 of the microprocessor-controlled circuit at Step S1. The A/D conversion means 40 converts the detected output voltage into digital data.

At Step 2, the detected temperature output which has been converted into the digital data is entered to the temperature data conversion means 41 so as to be converted into a specific temperature data value. Then, the temperature data value is entered into the temperature sensor output data correction means 43.

On the other hand, the temperature sensor output data correction means 43 receives from the temperature data correction signal generation means 42 a criteria signal of either Vo=+B=5 (V) or Vo=ground voltage=0 (V) respectively indicating that it is necessary and it is unnecessary to make a correction to the temperature data, depending on whether the first jumper wire 24 is cut or not, respectively.

Thus, at Step S3, it is determined whether the value of the criteria signal voltage Vo is either 0 (V) or 5 (V). When the first jumper wire 24 is not cut with the criteria signal voltage Vo of not more than 0 (V), or the remote controller is installed in the environment with an appropriate circulation of air, the process goes to Step S4, without making a correction to the temperature data Ti by the temperature sensor output data correction means 43. The remote-control thermo control means 44 controls the temperatures to be air-conditioned, while maintaining the temperature data Ti.

In contrast, as a result of the determination at Step 3, the first jumper wire 24 is cut with a value not less than 0 (V), or the remote controller is installed in the environment with a poor circulation of air, the process goes to Step 5 where the temperature sensor output data correction means 43 makes a correction (T=Ti–Δt) to the temperature data Ti detected by the temperature sensor 26. The remote-control thermo control means 44 controls temperatures to be air-conditioned by lowering the temperature data Ti by a predetermined degree of temperature Δt (Δt=2° C., for example).

As described above, there are cases where the air of the room cannot be properly introduced to the temperature sensor 26 in the remote controller, judging from the conditions of the environment where the air-conditioning apparatus is installed. In these cases, even if the temperature sensor 26 detects a temperature (Ti=T+Δt) higher than the actual temperature (T=Ti–Δt) of the air in the room, the remote controller can finally perform temperature control based on the nearly accurate temperature (T=Ti–Δt) of the room air.

Thus, it becomes possible to realize comfortableness expected from the temperature control by the remote controller.

MODIFIED EXAMPLE 1

In the above embodiment, the single first jumper wire 24 is exclusively used to generate the temperature data correction signals of a predetermined level (Δt=2° C.). Alternatively, a plurality of (two, for example) jumper wires could be used as the generation means. In other words, the generation means can perform a correction of Δt =2° C. when one of the jumper wires is cut, and perform a correction of Δt=4° C. when two of the jumper wires are cut. In this case, several correction levels could be used in accordance with the conditions of the environment to install the apparatuses.

MODIFIED EXAMPLE 2

The generation means to generate the temperature sensor output data correction signals is not limited to the above-mentioned jumper wires. As another generation means, an opening switch or a voltage-variable switch capable of generating similar voltage signals can be adopted to perform similar operations when they are in the ON state.

In such a structure, voltage values can be set in several levels by a simple method, thereby facilitating the temperature correction in several levels.

INDUSTRIAL APPLICABILITY

As described hereinbefore, the remote controller for an air-conditioning apparatus of the present invention is useful to detect temperatures and is particularly suitable for temperature detection when air conditioning is performed.

What is claimed is:

1. A remote controller for an air-conditioning apparatus comprising:

a remote controller case (1) having an opening for air intake (5);

a circuit board (10) having a temperature detection circuit stored in said remote controller case (1); and a temperature sensor (26) provided in said circuit board (10) in such a manner as to correspond to said opening for air intake (5), wherein said remote controller further comprises:

a temperature sensor output data correction means (43) for correcting output data of said temperature sensor (26); and a temperature data correction setting means for determining whether or not to operate said temperature sensor output data correction means (43).

2. The remote controller for an air-conditioning apparatus of claim 1, wherein said temperature sensor output data correction means (43) is so structured as to correct said output data of said temperature sensor (26) in such a manner as to lower said output data by a predetermined degree of temperature.

3. The remote controller for an air-conditioning apparatus of claim 1 or 2, wherein said temperature data correction setting means is composed of a jumper wire (24) provided on said circuit board (10) in such a manner as to correspond to said temperature sensor (26), and is so structured as to operate said temperature sensor output data correction means (43) based on a cut of said jumper wire (24).

4. The remote controller for an air-conditioning apparatus of claim 1 or 2, wherein said temperature data correction setting means is composed of a switch provided on said circuit board (10) in such a manner as to correspond to said temperature sensor (26), and operates said temperature sensor output data correction means (43) based on an ON condition of said switch.

* * * * *